United States Patent [19]
Casto et al.

[11] Patent Number: 5,045,914
[45] Date of Patent: Sep. 3, 1991

[54] PLASTIC PAD ARRAY ELECTRONIC IC DEVICE

[75] Inventors: James J. Casto; Michael B. McShane; Paul T. Lin, all of Austin, Tex.

[73] Assignee: Motorola, Inc., Schaumburg, Ill.

[21] Appl. No.: 663,225

[22] Filed: Mar. 1, 1991

Related U.S. Application Data

[63] Continuation of Ser. No. 456,996, Dec. 26, 1989, abandoned.

[51] Int. Cl.⁵ .................................. H01L 23/48
[52] U.S. Cl. .............................. 357/70; 357/72
[58] Field of Search ............... 357/70; 361/396, 403; 174/52.4

[56]  References Cited
U.S. PATENT DOCUMENTS

| | | | |
|---|---|---|---|
| 3,627,901 | 12/1971 | Happ | 357/70 |
| 3,874,759 | 4/1975 | Colombo | 361/403 |
| 4,102,039 | 7/1978 | Henrickson et al. | 29/593 |
| 4,398,235 | 8/1983 | Lutz et al. | 361/396 |
| 4,463,217 | 5/1984 | Orcutt | 174/52 |
| 4,701,781 | 10/1987 | Sankhagowit | 357/70 |
| 4,729,061 | 3/1988 | Brown | 361/386 |
| 4,739,443 | 4/1988 | Singhdeo | 361/382 |
| 4,772,936 | 9/1988 | Reding et al. | 357/80 |

OTHER PUBLICATIONS

D. Baldeves, "Heart Dissipation from IC chips Through Module Package", *IBM Technical Disclosure Bulletin*, vol. 19, No. 11, Apr. 1977, pp. 4165-4166.

Primary Examiner—Eugene R. Laroche
Assistant Examiner—R. Ratcliff
Attorney, Agent, or Firm—Robert L. King

[57] ABSTRACT

A pad array electronic device for mounting on a substrate, such as a printed circuit board (PCB), has a relatively rigid package body with a plurality of holes bearing connecting mechanisms for bonding to lands on the PCB. The package body may be a thermoset plastic or other material that can be injection molded around an electronic component, such as an integrated circuit (IC) bonded to a lead frame. An integrated circuit die or other electronic component is mounted in proximity with or on the lead frame and electrical connections between the integrated circuit chip and the frame are made by any conventional means. In one aspect, the substrate leads are provided at their outer ends that are exposed by holes in the package with solder balls or pads for making connections to the PCB. The package body may be optionally used to stand off the device a set distance from the PCB so that the solder balls will form the proper concave structure. The periphery of the package body may function as a carrier structure to protect the lead or connection structures during testing, handling and board mounting. The open vias permit back side testing of the device before or after mounting of the package to the PCB. Additionally, a heat sink structure and/or capacitor may be directly bonded to the side or the top of the pad array electronic device which may be used singly or in multiple, stacked configurations, to facilitate the thermal dissipation from the device.

17 Claims, 5 Drawing Sheets

PLASTIC PAD ARRAY ELECTROIC IC DEVICE

This application is a continuation of prior application Ser. No. 07/456,996, filed Dec. 26, 1989 abandoned.

CROSS-REFERENCE TO RELATED APPLICATION

This application is related to U.S. patent application Ser. No. 07/457,002, filed of even date, relating to a pad array carrier IC device using flexible tape that may contain a large number of leads and be surface mounted, but having the ability to flex with relatively large mechanical displacements over the area of the device.

FIELD OF THE INVENTION

The invention relates to electronic devices, and, in one aspect, more particularly relates to packages and containers for electronic devices such as integrated circuits, for example, which devices have a special mechanism or technique for bonding the device to the printed circuit board substrate.

BACKGROUND OF THE INVENTION

It is well known that an increasingly important consideration in the production and use of integrated circuits (ICs or IC devices) is the package in which the IC resides. The module or casing in which the IC is packaged is an important factor in the ultimate cost, performance and lifetime of the IC. For example, as ICs become more dense, the efficient dissipation of the thermal energy generated by them becomes increasingly important in permitting their useful life to be as long as possible. Another consideration as the circuits become more dense is that the number of leads to the device and connections from the leads to the integrated circuit pads increases. This increases the complexity of construction and adds to the cost of the end product, not just in terms of increased and more expensive materials, but also increased production costs. A package which has satisfactorily addressed the need of a large number of interconnections is the pin grid array (PGA) where a plurality of pins oriented normal to a relatively flat package body gives a "bed of nails" appearance. IC devices in PGA packages have proven popular when hundreds of connections must be made.

Another factor affecting the design of IC devices is the advent of surface mount technology, whereby space is conserved on the printed circuit boards (PCBs) by mounting the devices directly on the conductive patterns of the circuit board, rather than by extending the leads through holes in the board. This technology is an additional influence in making the device and its package smaller, and making it more difficult to design a small device and package that will dissipate thermal energy readily.

Thus, a continuing goal in the art of providing electronic components such as integrated circuits is a device design that will address these multiple goals satisfactorily in an arrangement that can be reliably manufactured at the lowest cost. The lowest cost devices are those which have plastic bodies which can be molded from thermoplastic and thermoset materials.

Addressing all of these goals has proven difficult. It has been hard to surface mount a device containing large numbers of leads; devices in PGAs traditionally must either be mounted through holes in the PCB or in a carrier that is in turn surface mounted. Additionally, PGAs are generally made of expensive ceramic materials, rather than the less expensive plastic compounds. Proposed methods of surface mounting devices having a large number of connections (that is, a "low cost" PGA), often require special treatment to the outer leads, such as providing bumps of solder or gold that prove difficult to fabricate and increase the cost of what is intended to be a relatively inexpensive device. Thus, the issues of very large pin counts, thermal dissipation, surface mounting and low cost are intertwined.

SUMMARY OF THE INVENTION

Accordingly, it is an object of the present invention to provide an integrated circuit device design that will permit the device to have very large pin or connection counts, but is relatively inexpensive to produce as compared with devices in the traditional PGA.

It is another object of the present invention to provide a pad array IC device that permits a large number of connections that may be surface mounted to a PCB or other substrate.

Still another object of the invention is to provide a high pin count, surface mounted device which that can be readily and reliably tested and manufactured.

It is yet another object of the present invention to provide a large array surface mounted device that readily incorporates features to permit the stand-off height of the device package to be readily set.

In carrying out these and other objects of the invention, there is provided, in one form, a pad array electronic IC device for mounting on a substrate, such as a printed circuit board (PCB) or flex circuit, having an electronic component with a plurality of bonding pads thereon and a lead frame around the electronic component, where the lead frame has a plurality of leads with proximal ends near the electronic component and distal ends on the opposite ends of the leads from the proximal ends. The lead frame additionally has a first planar side and a second planar side opposite the first planar side. Electrical connections are provided between the bonding pads and the proximal ends of leads. A package body extending beyond the first and second planar sides of the lead frame is also present which surrounds the electronic component, the proximal ends of the lead frame and the electronic connections. The package body also has a plurality of holes therethrough, where at least one lead is exposed in each hole. There is also provided on the device mechanisms for connecting the leads exposed in the holes to the substrate.

It will be appreciated that in the Figures the proportions of the various parts are not to scale. For example, the thicknesses of various components such as platings or coatings have been exaggerated for clarity.

DETAILED DESCRIPTION OF THE INVENTION

Figure 1:
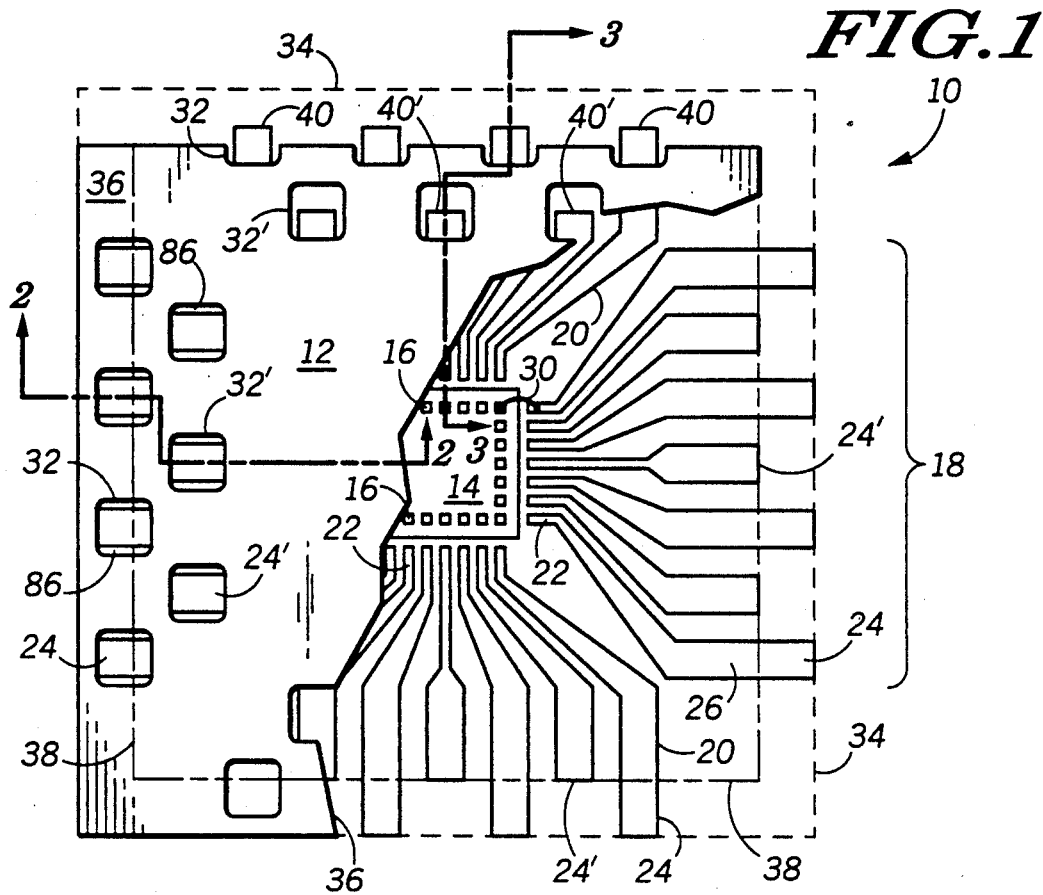
FIG. 1 is a sectional, plan view of the plastic pad array electronic IC device in various stages of assembly.

Shown in FIG. 1 is a sectional plan view of the plastic pad array electronic IC device 10 in various stages of construction. The package body 12 is broken away on the right side of the Figure to reveal an electronic component 14 having a plurality of bonding pads 16 thereon. While any electronic component 14 may be suitably contained in an embodiment of the invention, for the sake of illustration only it will be assumed that the electronic component 14 is an integrated circuit. It will also be appreciated that the number of bonding pads 16, leads, electrical connections, etc. are greatly reduced from the number on an actual integrated circuit of the very large scale integrated (VLSI) type, to which this invention is not necessarily limited.

Surrounding integrated circuit die 14 is a lead frame 18 having a plurality of leads 20 with proximal ends 22 near the bonding pads 16 of the die 14 and distal ends 24 on the opposite ends of the leads 20 from the proximal ends 22. Lead frame 18 also has a first planar side 26 and a second planar side 28 opposite the first planar side 26; which sides are more readily seen in FIGS. 2 and 3.

It should be appreciated that the term "lead frame" used throughout refers to any type of structure that may provide leads around an electronic component. Lead frames include, but are not necessarily limited to conventional stamped or etched frames of relatively thick leads; flexible, insulative sheets bearing copper traces as the leads; etc.

A number of electrical connections are made between the bonding pads 16 and the proximal ends 22 of the leads 20, most typically in a one-to-one relationship. The electrical connections may be made by wire bonds 30, or by any suitable means including, but not limited to, tape automated bonding (TAB) and "flip chip" bump bonding. If the chip 14 is flipped over for direct bonding to the proximal ends 22, the proximal ends 22 should extend under the chip 14 and either the proximal ends 22, bonding pads 16 or both should be provided with bumps of gold or copper or the like to facilitate the direct bonding by thermocompression techniques or other means.

Once all of the wire bonds 30 are made, the bulk of the assembly described above is surrounded in a package body 12 that extends beyond the first 26 and second 28 planar sides of the lead frame 18 (see FIGS. 2 and 3), at least covering the die 14, the proximal ends 22 and the electrical connections 30. The package body 12 has a plurality of holes 32 therethrough, where at least one lead 20 is exposed in each hole 32 as seen on the left side of FIG. 1. In the particular embodiment illustrated in FIG. 1, the distal ends 24 of the leads 20 have different lengths; note that alternating leads are shorter having proximal ends 24'. Holes 32' therefor are placed over these lead ends 24' to give holes 32 and 32' a staggered or interstitial relationship. This configuration permits the pitch of the test contacts to be considerably larger than the pitch of the leads 20 at points closer to the component 14.

Package body 12 is preferably injection molded around the lead frame 18 and component 14, where the mold cavity provides for the holes 32 and 32'. Any suitable thermoset or thermoplastic or similar material such as epoxy novolac resins, anhydride materials, liquid crystal polymers, Ryton, fiber reinforced materials, as examples only, may be used. It is conceivable, however, that pre-molded piece parts made from plastic, ceramic or other materials might be employed in some aspects of the invention. The outer dimension of the package body 12 is defined by line 34. It will further be appreciated that since the package body 12 extends laterally beyond the ends of the distal ends 24 of leads 20 that the package 12 periphery 36 serves as an integral carrier structure that protects the leads 20 during all testing and handling operations.

Another part of the invention involves a mechanism for connecting the leads 20 to the printed circuit board. In the particular embodiment illustrated in FIGS. 1 through 4, after testing of the electrical connections 30 and component 14 by contacting the exposed portions of leads 20, the distal ends 24 and 24' are severed within the holes 32 and 32' respectively at the points farthest from the electronic component 14 and formed into a configuration 40 and 40' suitable for bonding to the lands 42 of a PCB substrate 44, as depicted in FIG. 3. It will be appreciated that although the term "PCB" is often used, that any substrate suitable for mounting the device 10 thereon is intended to be included. For example, a flex circuit substrate may also be used.

The particular lead configuration formed may be any suitable shape and may include, but is not limited to, butt-lead (depicted in FIG. 3), J-lead and gull-wing. While configurations suitable for surface mounting are preferred, through-hole configurations may also be formed, if desired. The periphery 36 may optionally be cut away or excised at line 38 (see FIGS. 1 and 2) to reduce the lateral space consumed by the device 10 or "footprint" so that it consumes less space on the printed circuit board 44. Alternatively, the periphery 36 may be left in place to protect the leads 40 and soldered lead bonds 46 to lands 42. The stagered, formed leads 40 and 40' also function here to increase the available lead count for a high "pin out" part by having two sets of leads 40 and 40' at the minimum lead pitch for the PCB 44 level. It will be apparent that more than two sets of leads 20 may be staggered in the manner illustrated and that more than two sets of holes 32 may be provided to test and form the proximal ends 24 of leads 20. Compared to a typical plastic device with leads only on the periphery of the device, the concept of the invention allows a higher lead count on the same substrate area at the same pitch.

Figure 4:
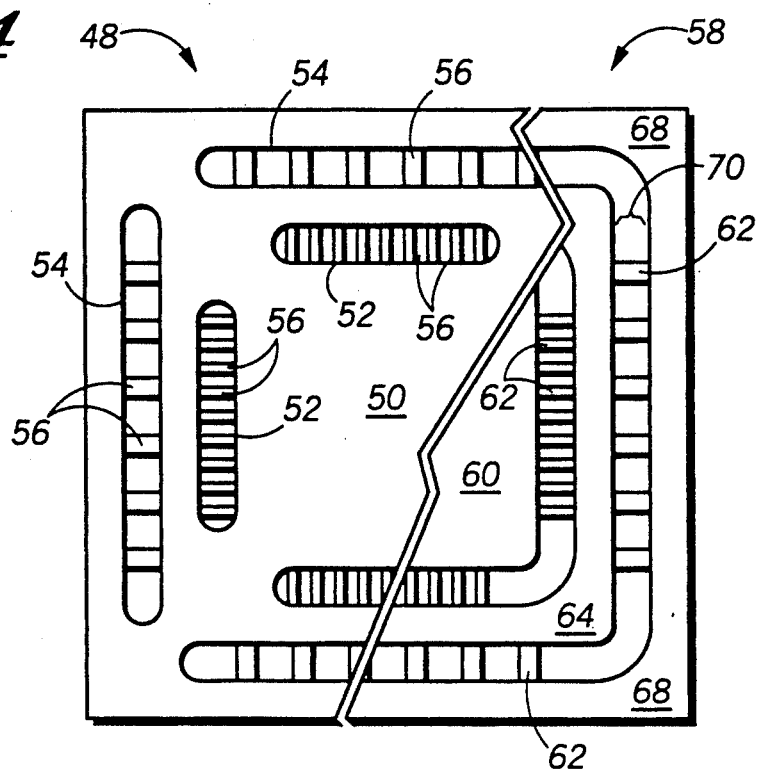
FIG. 4 is a plan view of the plastic pad array electronic IC device of the invention in two other embodiments.

FIG. 4 illustrates, in plan view, two alternate versions of the invention, shown together for comparison. On the left side of FIG. 4 is device 48 with a package body 50 having two sets of holes or slots, inner holes 52 and outer holes 54. Both inner 52 and outer holes 54 expose more than one lead 56; note than inner slot 52 exposes all of the leads 56 while outer slot 54 exposes only half of the leads 56, in fact alternate leads. Again, the leads 56 exposed through outer slot 54 may be tested, formed and mounted on a wider pitch than those exposed in inner slot 52.

Alternate device 58 on the right side of FIG. 4 depicts an embodiment where a package body 60 encapsulates the electronic component and the bonds to the proximal ends of leads 62, and two carrier structures or rings, a proximal ring 64 separated from the package body 60 by a first space 66, and a distal ring 68 separated from the proximal ring by second space 70.

Figure 2:
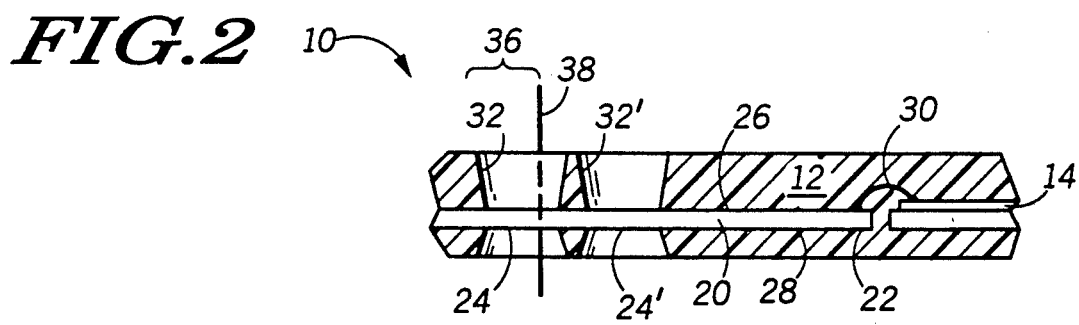
FIG. 2 is a cross sectional profile view of the plastic pad array electronic IC device of FIG. 1 taken along line 2—2.
Figure 3:
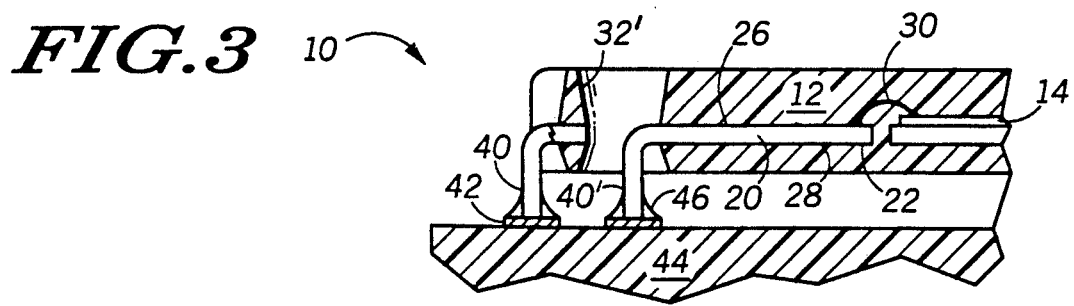
FIG. 3 is a cross sectional profile view of the plastic pad array electronic IC device of FIG. 1 taken along line 3—3.

The same principles of testing the leads, forming the leads and mounting the device 10 of FIGS. 1-3 apply to these embodiments 50/60. The leads 56 and 62 may be tested at different pitches, if desired. Note that in these embodiments, the width of the lead and its pitch both increase as it extends farther from the center of the package. The leads 56 and 52 may be excised at their ends in the slots or spaces, as appropriate, furthest from the electronic component to be formed into configurations suitable for bonding to a substrate. Optionally, the outside perimeters or peripheries of each of these two package aspects may be excised to reduce the footprint of the devices 48 and 58.

Figure 5:
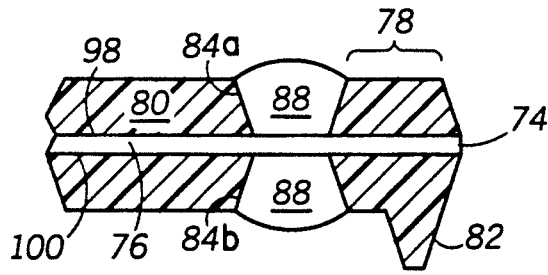
FIG. 5 is a detailed, profile view of one of the holes of the plastic IC device package filled with solder prior to bonding to a printed circuit board.
Figure 6:
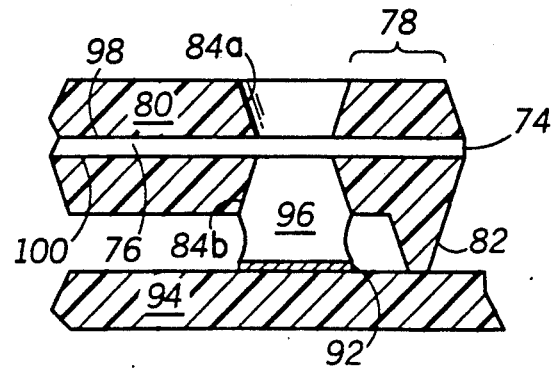
FIG. 6 is the profile view in FIG. 5 after a solder bond has been made to a printed circuit board.
Figure 7:
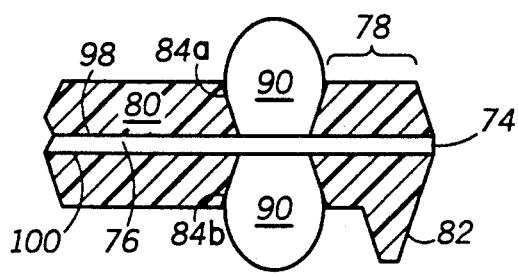
FIG. 7 is a detailed, profile view of another method by which solder may fill the holes.

Shown in FIGS. 5 through 7 are alternate mechanisms for connecting leads to a substrate. These FIGS. have only one lead 76 per hole 84. Shown in FIG. 5 is a detailed profile view of a device 72 similar to that previously described with respect to the left side of FIG. 1 where the distal end 74 of a lead 76 is present at the periphery 78 of a package body 80. The lower portion of package body 80 is optionally provided with a stand-off structure 82, the purpose of which will be described later. A hole 84 is provided to exposed lead 76 in a manner such as that depicted in FIG. 1, including the spaces 86 (see FIG. 1) on either side of the lead. Another way of stating this feature is to say that lead 74 does not completely obscure hole 84 which exposes it. In this embodiment, holes 84 are filled with a reflowable, electrically conductive material 88, such as solder. The material 88 may be provided in only the top 84a or bottom 84b of hole 84, or both as depicted in FIG. 5, depending on where the bond is to be made.

The material 88 may be provided in holes 84 by a variety of techniques, only a few of which will be described here. If a solder paste that is screened on is employed, a profile similar to that seen in FIG. 5 will be obtained. If solder balls 90 are used, a profile similar to that seen in FIG. 7 is obtained. Indeed, both of these techniques, and others, such as printing on solder paste, are common. It is known to apply solder balls by placing a template over a package body with holes in the template where the solder balls are to be placed. The solder balls are spread over the template, fall through the holes, like the balls in a child's puzzle game, and are reflowed slightly in a thermal step to secure them in place. A similar process may be applied to the device 72 of the present invention to give the profile of FIG. 7 except that the need for a separate template is eliminated since the package body 80 itself serves as the template. If the solder balls 90 are reflowed to a greater extent, a profile more similar to that seen in FIG. 5 may be obtained.

Thus, the plastic pad array electronic IC device of the present invention has the advantage of being able to carry the solder used for bonding to the lands 92 of a printed circuit board 94 along with it. This feature eliminates or reduces the need for the end user to separately apply solder during the board assembly. The device 72 may be simply placed on the substrate 94 in the appropriate position with the holes 84 registered over corresponding lands 92 and the material 88 may be reflowed to make bonds 96 as depicted in FIG. 6. Optional stand-off structures 82 may permit the device 72 to be mounted at an appropriate height over board 94 so that solder bonds 96 may have the proper profile. Bonds 96 preferably have concave sides as seen in FIG. 6. The bond will be less strong if the distance of the device 72 to the board 94 is too small, forming bonds with convex sides, or if the distance is too great, running the risk of forming an undesirably narrow joint or not forming connections at all. If spaces 86 (see FIG. 1) are present between the leads 76 and the sides of holes 84 sufficient to permit the passage of solder 88 between the first plane 98 and second opposite plane 100 of the lead frame, then the solder 88 may pass from upper hole 84a to lower hole 84b to secure the connection 96.

In another version of the present invention, it is expected that connections may be made to the top of the device in a multiple device or stacking arrangement. While this extension of the inventive technology will be discussed more later, it will be appreciated that such topside connections will be aided by the presence of reflowable, electrically conductive material 88 and 90 in FIGS. 5 and 7, respectively, in top hole 84a. Alternatively, a reservoir of material 88 in top hole 84a may be desirable if the connection 96 is expected to be particularly tall, and/or an extra measure of material (e.g. solder) 88 is desired. Of course, space 86 must be present for material 88 to flow from top hole 84a to bottom hole 84b. Thus, it may be seen that the holes 84 filled with solder 88 or other reflowable material has the advantage of carrying and aligning the solder over the leads. If the solder 88 extends from the holes, as with solder balls 90 as seen in FIG. 7, testing of the device 72 is easier. There are less processing and alignment steps with the inventive device than with current approaches, since the solder 88 and 90 for the connections 96 are already present and aligned with one alignment step. The solder ball and hole approach allow for inspection of the solder joint after board mount and for trouble shooting of test failures because of probe access to the top hole 84a. If the package body happened to be transparent, joint inspection could be facilitated. Testing prior to mounting is also made easier by the protruding bumps that the balls provide.

Figure 8:
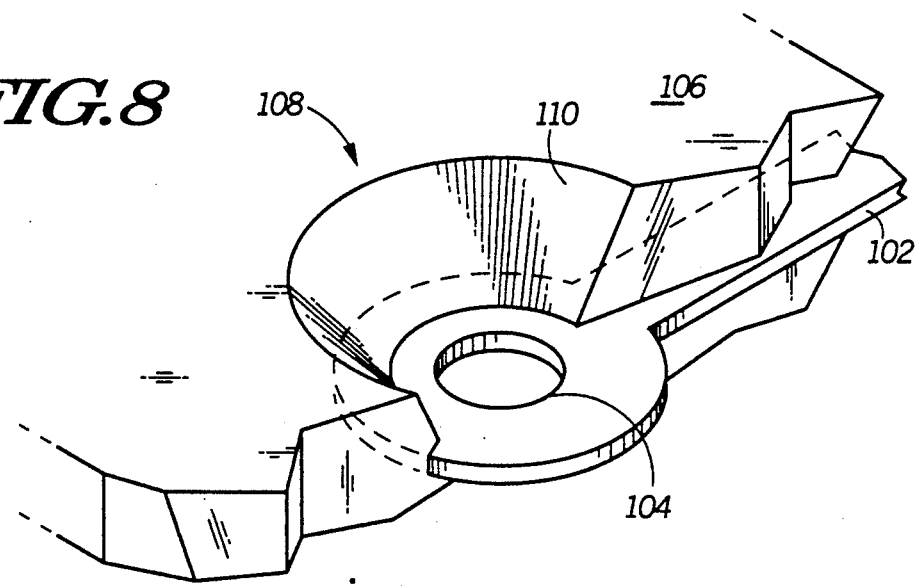
FIG. 8 is a three-quarters, sectional view of an alternate aspect of a lead and hole configuration that is anticipated by the present invention.

A potential problem in molding the holes in package body is that excess mold material may fill the space (see 86 in FIG. 1) between the leads and the sides of the holes exposing those leads. Such excess mold material is generally undesirable and could possibly completely fill this space, which may, in some versions of the invention, be essential for providing reliable solder connections or joints. An alternative design would be to provide a lead 102 with a space or hole 104 therethrough as depicted in FIG. 8. While mold flash from package body 106 may still occur, it would be less likely to completely clog central hole 104, thereby permitting solder to flow through it, if required. Note that hole 108 in package body 106 has sloped walls 110 to facilitate the insertion of a probe from a testing apparatus, or the lead from another subsequently mounted device.

It will be appreciated that the spaces 86 depicted in FIG. 1 and the hole 104 of FIG. 8, when surrounded by the solder of a joint or connection will form a physically stronger bond than the joint formed when the solder is simply adhering to the flat underside of a lead. Space 86 and hole 104 should be large enough to permit solder or the like to flow through in a reflow step. This space or hole size cannot be absolutely specified since it depends on the physical characteristics of the reflowable material used. Nevertheless, joints of both types (more tightly and less tightly secured to the lead) will find application in the art. The exact type of package desired and joint provided will depend on the end use of the device and the environment in which it will be placed.

Figure 9:
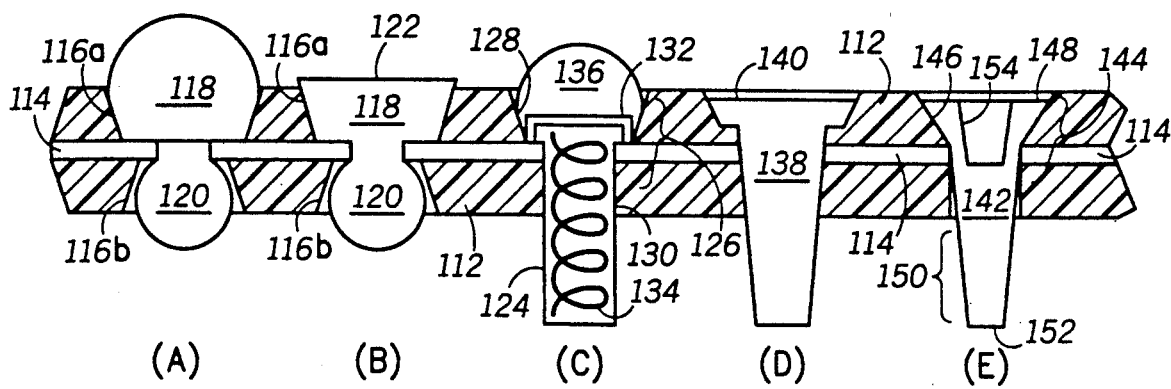
FIG. 9 is a detailed, profile view of other various ways in which the contact holes of the plastic pad array electronic IC device may be filled with contact structures.

Shown in FIG. 9 is a profile view of another embodiment of the plastic pad array electronic IC device 112 of the present invention illustrating further the different structures that may fill the holes for connecting the lead 114 to the printed circuit board (not shown in this view). In each of the variations illustrated in FIG. 9 there will be present a hole in or near the center of the exposed portion of the lead 114, similar to the version just discussed with reference to FIG. 8, which hole may have different shapes, areas or, diameters, from one to the other.

From left to right in FIG. 9, the structure (A) may have a hole 116 exposing lead 114, where the upper portion 116a is larger than the lower portion 116b, so that upper solder ball 118 is considerably larger than lower solder ball 120 to serve as the supply of solder to the bond or joint to be made, either from above or below. Structure (B) is similar to that of (A), except that a flat surface 122 is provided to permit testing of the device 112 and its joints or connections from the top side thereof. Flat surface 122 may be formed by providing a solder ball using a method earlier described and then flattening its surface by physical compression, a thermal reflow step or a combination of the two, such as thermally softening the solder and pressing the ball against a flat surface.

In structure (C), a short pin 124 is placed in hole 126 having a relatively wide, sloping opening 128 at the top, and a relatively narrower, straight-walled opening 130 at the bottom to accommodate the contour of the pin 124. Pin 124 may be a solid structure of suitable electrically or thermally conductive material including, but not limited to, copper, aluminum, gold, solder, and various alloys and mixtures thereof. If pin 124 is solder, it may additionally possess a metal cap 132 of one of the above-noted metals or alloys, or a spring structure 134, which may aid in a controlled collapse of the pin 124 during the process of bonding structure (C) to the PCB so that a certain height may be assured. Formed solder columns, with and without collapse control mechanisms are known in the art. If a connection is to be made to the top side of pin 124, a portion 136 of a reflowable material, such as solder for example, already present may prove helpful in the manner previously described.

Structure (D) of FIG. 9 illustrates a heat spreader pin 138. Note that pin 138 is generally wider than the other pins and thus has a top surface 140 optimized for thermal dissipation. It is anticipated that in some versions of the invention the surface area of heat dissipation surface 140 may be increased by roughening, or the presence of fins or other structures well known in the art of designing heat sinks, but not explicitly shown herein. Thus, it will be appreciated that a heat dissipation function may be served by some of the leadtype structures integral with the lead frame of the present invention. See the portion of this Description relating to FIG. 10 for a more complete discussion of the thermal dissipation capabilities of the invention.

On the right side of FIG. 9 is a depiction of a stacking pin 142 in a hole 144 with a top, sloping portion 146 thereof to accommodate the beveled profile of pin 142 head 148; of structure (E). Shank 150 of pin 142 extends well below the device 112 and may be slightly tapered to a contact point 152. The bottom contour of hole 144 need only be wide enough to accommodate shank 150. Note that pin head 148 is provided with a recess 154 of an appropriate shape for receiving the contact point 152 of another stacking pin 142. While the taper of the sides of shank 150 and recess 154 may not be absolutely necessary, such tapering will help set contact point 152 in recess 154 when devices 112 are aligned and stacked on one another for multiple device assembly. Solder may be provided as needed to head 148 for top side connecting thereto.

All of these interconnection configurations may be used with high pin count, surface mounted devices. They apply to pin or pad arrays where the pads are present over a large part of the device area, rather than only around the periphery. Of course, this invention could be used for a device having leads only on the periphery.

Figure 10:
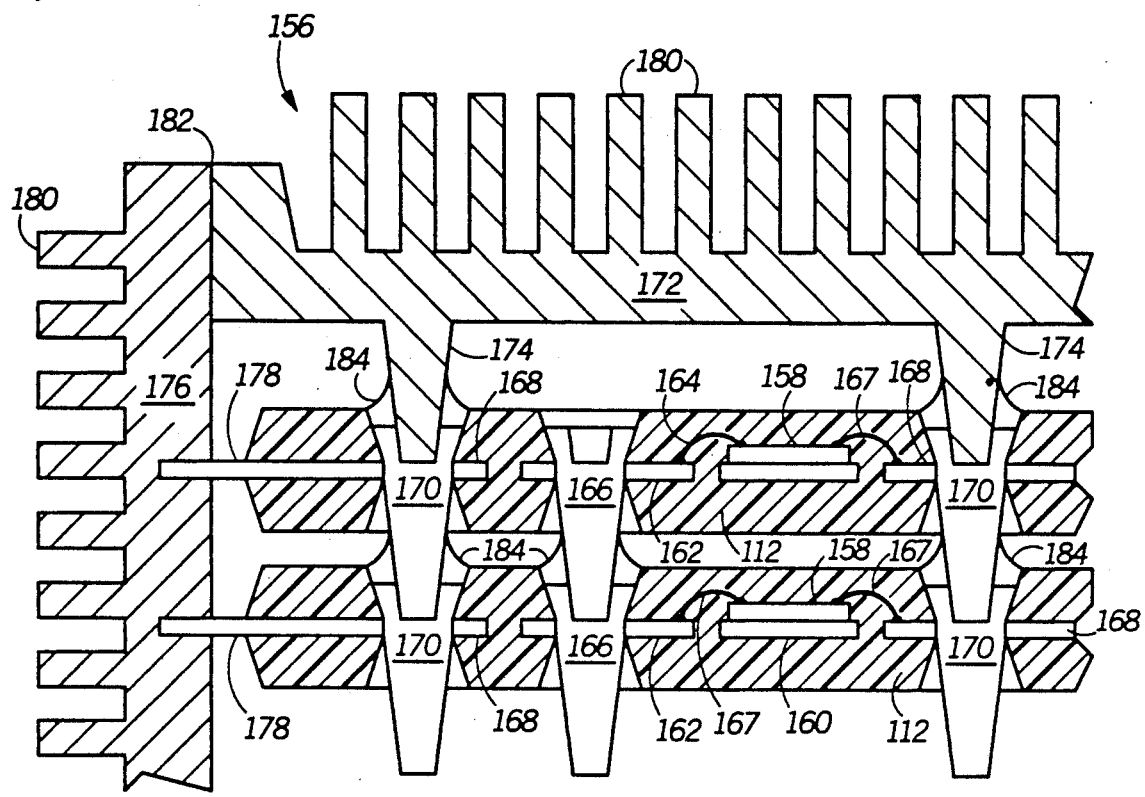
FIG. 10 is a profile, sectional view of two plastic pad array electronic IC devices of the present invention in a stacked, interconnected configuration illustrating how the contact structures may be used to dissipate heat from the electronic components.

Stacking pin 142 may be designed to serve as an electrical signal carrier in some positions of the device 112, and as a thermal dissipation mechanism in other portions of the device 112. For example, FIG. 10 illustrates a circuit assembly 156 having two plastic pad array electronic devices 112, in a stacking arrangement. Devices 112 bear integrated circuit die 158 mounted on die bond flags 160, the die 158 being electrically connected to leads 162 via wire bonds 164. Leads 162 are connected to signal pins 166 which are connected to each other and may ultimately be in electrical connection with a bonding land of the substrate (not shown). It is apparent that where connection is not desirable between corresponding positions on adjacent devices 112 that one or more connecting signal pins 166 should not be present. It would be expected, however, that the power or ground pins would be common to each device 112 in the assembly 156 and that all would be connected together. Chips 158 are also connected via wire bond 167 to a thermal dissipation lead 168 which is in intimate connection with thermal dissipation pin 170, which may be in communication with other thermal dissipation pins in the assembly 156 and ultimately with upper heat sink 172 via its contact pins 174, or side heat sink 176 via extensions 178 on thermal dissipation leads 168, as seen on the left side of FIG. 10. It will be appreciated that the contact to upper heat sink 172 and side heat sink 176 could be accomplished by mechanisms other than those exactly depicted here. Both upper heat sink 172 and side heat sink 176 may be provided with an increased surface area including, but not limited to fins 180, and may or may not be connected at joint 182, as desired. It is apparent that assembly 156 is not limited to the particular design illustrated in FIG. 10 and that thermal dissipation pins 170 and signal pins 166 may be provided over the devices 112 as the design demands. Thermal dissipation pins 170 and signal, ground, or power pins 166 may be identical in design, or may be different. For example, the pins for power, ground and thermal dissipation may be larger than the signal pins to accommodate the larger current or thermal load, as necessary. The thermal dissipation leads 168 and thermal dissipation pins 170 on the left side of FIG. 10 are not depicted as directly connected to component 158 and do not need to be. They may be placed in devices 112 wherever it is expected that thermal dissipation is required. Thermal dissipation occurs along paths where less thermal energy is present to diffuse the energy over the volume of the available path and does not require a connection of the type needed for electrical connection. Solder bonds 184 or other suitable intimate connection may be made for both the electrical circuit and the thermal dissipation system that is integrated therewith.

From FIG. 10, it may be appreciated that by using the plastic pad array electronic device of the present invention, the devices can be individually fully tested and burned in and then stacked in a three dimensional array using conventional solder reflow techniques. One or more heat spreaders may also be added to facilitate thermal dissipation. The same lead and interconnect mechanisms used to complete the eletrical circuits may be used "as is" or adapted to channel thermal energy out of the device or the entire stacked circuit assembly by other routes.

Figure 11:
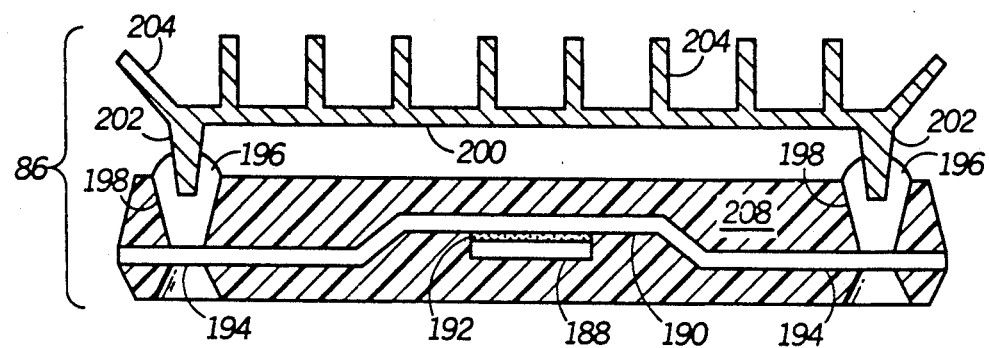
FIG. 11 is a profile, sectional view of another embodiment of the IC device of this invention illustrating how a heat spreader may be mounted thereto.

Shown in FIG. 11 is another embodiment of the device invention showing a device assembly 186 bearing an IC chip 188 bonded to a die bond flag 190 by means of die bond adhesive 192. Die bond flag 190 is held in place by tie bars 194 on either side which are used here to help dissipate thermal energy through solder connections 196 in holes 198 that expose a portion of the tie bars 194. Heat spreader 200 bears mounting posts 202 for engaging the device 186 and being bonded there to by connections 196. Spreader 200 may optionally have a plurality of fins 204 to aid in the thermal dissipation. Note that chip 188 may be mounted in an inverted position, as shown in FIG. 11.

Figure 12:
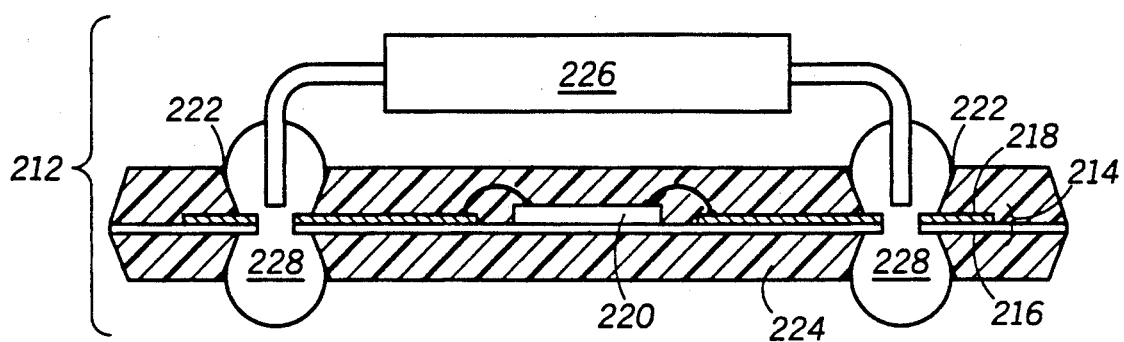
FIG. 12 is a profile, sectional view of yet another version of the IC device of the invention showing how a decoupling capacitor may be mounted thereto.

Another version of the inventive device is seen in the device assembly 212 of FIG. 12 which shows that a "tape" lead frame 214 may be used, which comprises a thin, insulative layer 216 and a plurality of copper traces or leads 218 thereon. Tape lead frame 214 may be used when it is desired to have a particularly thin electronic component device. Such lead frames may be manufactured using conventional PCB or tape automated bonding (TAB) technology. The thin layer 216 may serve to directly support the chip 220 at a central position. Holes 222 may be present in package body 224 to expose the traces 218. In this device assembly 212, the additional component 226 mounted in holes 222 by solder connection 228 may be a capacitor, such as a decoupling capacitor between ground and power lines for example only.

It will be appreciated that various features of the invention may be combined in configurations not explicitly shown. For example, a version of the invention such as that seen in FIG. 11 may have a decoupling capacitor 226 in the position seen in FIG. 12 which may be simultaneously employed with heat spreader 200.

Figure 13:
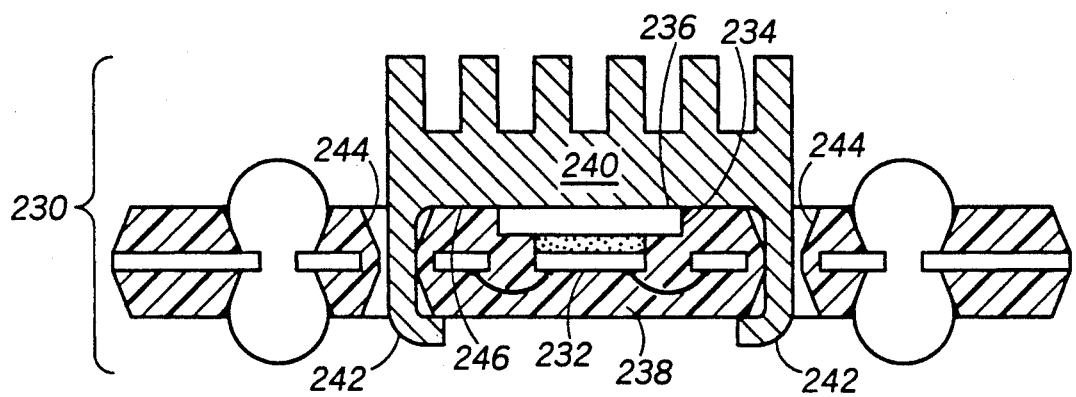
FIG. 13 is another profile, sectional view of a version of this invention that uses a clip-on type of heat spreader.

A version of the invention seen in FIG. 13 is a device assembly 230 having an IC chip 232 mounted on a die bond flag 234 that has a back side 236 open or exposed in the package body 238. A "clip-on" heat spreader 240 has a mechanism 242 for attaching the spreader 240 to the package body 238. In the particular embodiment shown, the attachment mechanism 242 is two prongs that penetrate holes 244 in package body 238 and clasp onto the back side thereof to hold it in place. It is anticipated that the heat spreader 240 and the mechanisms 242 is simply aligned and placed on those devices that require such heat dissipation assistance. In this way, the bottom surface 246 of heat spreader 240 is in intimate contact with the back side 236 of die bond flag 234 to facilitate the dissipation of thermal energy therefrom. It may be desirable in some cases to provide an adhesive, such as epoxy or solder or the like (not shown) to ensure that the physical connection between bottom surface 246 and back side is a close one. It will be appreciated that a variation on assembly 230 would be to physically bond, such as by solder or the like, attachment mechanisms 242 to heat carrying features of the device, such as the tie bars 194 of FIG. 11, to aid in the thermal dissipation.

Figure 14:
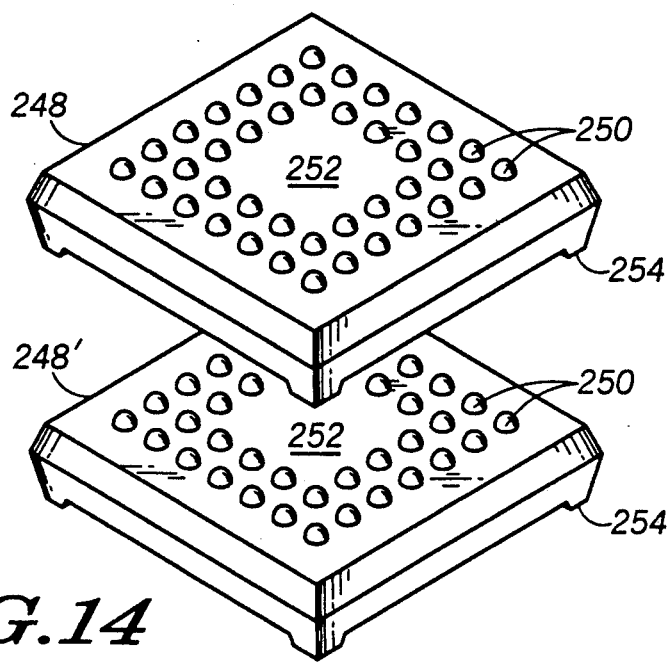
FIG. 14 is a three-quarters view of two separate IC devices of the invention illustrating that they may be separately tested prior to interconnection with each other.

FIG. 14 is a three-quarters illustration of two electronic devices 248 and 248' of the present invention illustrating that they exist separately and are assembled and tested separately prior to assembly on top of on another. The solder balls 250 are visible in the holes in the package body 252 and may be readily tested. Note that the devices 248 are provided with stand-off structures 254 so that they may be spaced a proper, predetermined distance from the mounting substrate. Of course, the mounting substrate for the upper device 248 is the lower device 248'. Nevertheless, structures 254 will provide the correct stand-off distance for the desired bond form.

Many modifications may be made in the structure and process of the present invention without departing from the scope thereof. For example, the various features of the invention may be combined in a way not explicitly illustrated herein. Although TAB interconnection is not explicitly shown, it may certainly be used. It is anticipated that the devices of this invention could also be made from premolded piece parts, even ceramic parts that are sealed together around the lead frame using suitable and/or conventional frit glass compounds. Devices of the sort described may also be envisioned without an "open via", that is, where the hole is not opened on the top portion of the package body and the connection mechanism is apparent only from the bottom of the device.

We claim:

1. A method for making a pad array electronic device for mounting on a substrate comprising the steps of:
    placing an electronic component having a plurality of bonding pads thereon inside a lead frame, where the lead frame has a plurality of leads, each lead having a proximal end and a distal end, the proximal end being closer to the electronic component than the distal end;
    electrically connecting the bonding pads on the electronic component to the proximal ends of the leads;
    providing a molded package body having a periphery which completely encapsulates the electronic component, the proximal and distal ends of the plurality of leads, and the electronic connections, where the package body has an array of holes therethrough, each hole exposing a portion of one of each of the plurality of leads and where all of the plurality of leads are contained within the periphery of the package body; and providing a flowable coupling material disposed within each of the holes through the package body which is electrically coupled to the exposed portions of the leads therein.

2. A pad array electronic device for mounting on a substrate comprising:

an electronic component having a plurality of bonding pads thereon;

a lead frame around the electronic component having a plurality of leads, each lead having a proximal end and a distal end, the proximal end of each lead being closer to the electronic component than the distal end;

electrical connections between the plurality of bonding pads and the proximal ends of the plurality of leads;

a molded package body having a periphery which completely encapsulates the electronic component, the electrical connections, and proximal ends of the plurality of leads such that all the leads are contained within the package body periphery;

an array of holes extending into the package body, each hole exposing a portion between the proximal and distal ends of one of each of the plurality of leads; and a flowable coupling material disposed within each of the holes through the package body and electrically coupled to the exposed portions of the leads therein.

3. The pad array electronic device of claim 2 wherein the array of holes is spaced apart from the package body periphery.

4. The pad array electronic device of claim 2 wherein the flowable coupling material comprises solder.

5. The pad array electronic device of claim 2 wherein the flowable coupling material within each hole extends beyond the package body to facilitate coupling the device to the substrate.

6. The pad array electronic device of claim 2 wherein the flowable coupling material comprises a solder ball coupled to each of the exposed portions of the plurality of leads.

7. The pad array electronic device of claim 2 further comprising an opening in each of the exposed portions of the plurality of leads sufficient in size to permit passage of the flowable coupling material through the opening.

8. A pad array electronic device for mounting on a substrate comprising:

an electronic component having a plurality of bonding pads thereon;

a lead frame around the electronic component having a plurality of leads, each lead having a proximal end and a distal end, the proximal end of each lead being closer to the electronic component than the distal end;

electrical connections between the plurality of bonding pads and the proximal ends of the plurality of leads;

a molded package body having a periphery which completely encapsulates the electronic component, the electrical connections, and proximal and distal ends of the plurality of leads, the package body having an array of holes therethrough, each hole exposing a portion of one of each of the plurality of leads;

an opening in each of the exposed portions of the plurality of leads; and a flowable coupling material disposed within each of the holes which substantially occupies the opening in each of the exposed portions of the plurality of leads.

9. The pad array electronic device of claim 8 wherein the flowable coupling material extends beyond the package body to facilitate coupling the device to the substrate.

10. The pad array electronic device of claim 8 wherein the portions of the plurality of leads exposed in the holes are the distal ends of the plurality of leads.

11. The pad array electronic device of claim 8 further comprising a component affixed in at least one of the holes through the package body.

12. The pad array electronic device of claim 11 wherein the component is used for dissipating heat.

13. The pad array electronic device of claim 11 wherein the component is electrically coupled to ground.

14. The pad array electronic device of claim 8 wherein the array of holes comprises an array of holes defined by four sides and wherein each side of the array has at least one row of associated holes.

15. The pad array electronic device of claim 8 wherein the flowable coupling material is solder.

16. The pad array electronic device of claim 8 wherein the flowable coupling material used to electrically couple the leads to the substrate comprises a solder ball coupled to each of the exposed portions of the plurality of leads.

17. The pad array electronic device of claim 8 further comprising stand-off structures located on a surface of the package body to support the device on the substrate.

* * * * *